United States Patent [19]

Utsumi et al.

[11] Patent Number: 4,681,667
[45] Date of Patent: Jul. 21, 1987

[54] METHOD OF PRODUCING ELECTROSTRICTIVE EFFECT ELEMENT

[75] Inventors: Kazuaki Utsumi; Atsushi Ochi; Masanori Suzuki; Mitsuhiro Midorikawa, all of Tokyo, Japan

[73] Assignee: NEC Corporation, Tokyo, Japan

[21] Appl. No.: 940,210

[22] Filed: Dec. 10, 1986

Related U.S. Application Data

[63] Continuation of Ser. No. 564,652, Dec. 22, 1983, abandoned.

[30] Foreign Application Priority Data

Dec. 22, 1982 [JP] Japan ............................. 57-225169
Mar. 24, 1983 [JP] Japan ............................. 58-49250
Oct. 18, 1983 [JP] Japan ............................. 58-194901
Oct. 18, 1983 [JP] Japan ............................. 58-194902
Oct. 18, 1983 [JP] Japan ............................. 58-194903
Oct. 18, 1983 [JP] Japan ............................. 58-194904

[51] Int. Cl.$^4$ ............................................. C25G 7/00
[52] U.S. Cl. ................................. 204/15; 204/180.2; 204/180.6; 204/181.1; 204/181.5
[58] Field of Search ................. 204/15, 181.1, 180.2, 204/181.5, 180.6

[56] References Cited

U.S. PATENT DOCUMENTS

| | | | |
|---|---|---|---|
| 2,894,317 | 7/1959 | Marks | 310/338 |
| 3,336,345 | 1/1975 | Yamamoto | 204/181 N |
| 3,895,127 | 7/1975 | Comizzoli | 204/181 N |
| 4,177,138 | 12/1979 | Mastuzaki et al. | 204/180 P |
| 4,445,256 | 5/1984 | Huguenin et al. | 310/340 |
| 4,482,447 | 11/1984 | Mizuguchi et al. | 204/181 R |
| 4,512,854 | 4/1985 | Grah | 204/15 |

FOREIGN PATENT DOCUMENTS

| | | |
|---|---|---|
| 8426 | 3/1973 | Japan. |
| 108557 | 8/1978 | Japan. |
| 50629 | 4/1980 | Japan. |
| 83238 | 6/1980 | Japan. |

OTHER PUBLICATIONS

Hewins, T. F., et al., "Plating Process", *IBM Technical Disclosure Bulletin*, vol. 2, No. 3, p. 32 (Oct. 1959).

Yeates, R. L., *Electropainting*, Robert Draper Ltd., Teddington, Second Edition, pp. 172-173 (Oct. 1970).

Primary Examiner—R. L. Andrews
Attorney, Agent, or Firm—Sughrue, Mion, Zinn, Macpeak, and Seas

[57] ABSTRACT

A method of producing a laminated type electrostrictive effect element composed of a plurality of layers of electrostrictive material and a plurality of thin internal electrodes placed between adjacent layers of the electrostrictive material. The internal electrodes are exposed in side surfaces of the electrostrictive element parallel to the direction of lamination. Alternate internal electrodes are electrically connected in common to form a first group and a second group of internal electrodes, for connection to a power supply to produce a longitudinal electrostrictive strain in the direction of lamination. The method of the invention provides an efficient technique for electrically connecting alternate internal electrodes in common. The method involves forming an insulating layer of inorganic material such as glass or glass-ceramics over the portions of the exposed internal electrodes which are not to be electrically connected. The inorganic insulating material is formed by an electrophoretic process and sintered to produce an integral body consisiting of the internal electrodes, the electrostrictive material and the inorganic insulating material. In one embodiment of the invention the laminated type electrostrictive effect element is immersed in a suspension solution containing electrically charged glass powder. A voltage is applied to the internal electrodes on which the insulating layer is to be formed and an opposing electrode plate in the suspension solution is connected to the opposite polarity supply voltage. The positively charged glass powder is thereby deposited on the exposed portions of the internal electrodes connected to the voltage supply of selected polarity. Alternatively, the laminated type electrostrictive effect element is immersed in a suspension solution containing previously charged glass powder to deposit the glass powder onto the entire surface of the laminated structure. Thereafter, an electric field is applied between the internal electrodes on which the insulating layer is not to be formed and an opposing electrode plate disposed within the suspension to remove the glass powder from the selected internal electrodes.

18 Claims, 12 Drawing Figures

METHOD OF PRODUCING ELECTROSTRICTIVE EFFECT ELEMENT

This application is a continuation of U.S. patent application Ser. No. 564,652, now abandoned.

BACKGROUND OF THE INVENTION

The present invention relates to a method of producing a laminated-type electrostrictive effect element which makes use of the longitudinal electrostrictive effect.

The copending U.S. patent application Ser. No. 493,583 discloses a laminated-type electrostrictive effect element having a plurality of thin plates made of an electrostrictive material and a plurality of alternating, superposed internal electrodes. Alternate internal electrodes are connected in common to form a first and a second group of electrodes and supplied with positive and negative voltages, respectively, by an external power supply so as to produce a longitudinal electrostrictive strain in the direction of lamination. Because of the use of the thin electrostrictive plates, this laminated-type electrostrictive effect element can operate at a low voltage. In addition, a large strain effect, i.e., a large displacement, is ensured due to the laminated structure. For these reasons, this electrostrictive effect element is expected to find various uses in a printer head of an impact printer, in a relay, and so forth.

However, it is difficult to electrically connect the electrodes of each of the groups of electrodes in common and to the external power supply. This is due to the extremely small distance between adjacent internal electrodes which is as small as several tens of microns to one millimeter, resulting from the use of very thin plates of electrostrictive material.

To obviate this problem, the above-mentioned U.S. patent application Ser. No. 493,583 proposes to form an insulating layer of a stretchable, flexible, soft organic material on the exposed side ends of the internal electrodes which are not to be connected electrically. The insulating layer made of the organic material, however, exhibits an inferior adhesion to ceramics, metals or the like material. In addition, the organic material exhibits an inferior moisture-proofness. For these reasons, the organic material cannot provide satisfactory electric insulation in the electrostrictive element which is subjected to a high voltage. Particularly, in the laminated-type electrostrictive effect element, a high voltage of several tens to several hundreds of volts is applied between adjacent internal electrodes, a distance as small as several tens of microns to 1 millimeter. Thus it is difficult to obtain a practical element with an insulating layer of organic material.

SUMMARY OF THE INVENTION

Accordingly, an object of the invention is to provide a method of producing an electrostrictive effect element in which insulating layers are formed only on and around the exposed side ends of the internal electrodes of the element.

According to the invention, there is provided an electrostrictive effect element having films or plates of electrostrictive material and alternating, superposed internal electrode plates such that the end surfaces of the internal electrode plates are exposed at both side surfaces of the element, and all of the exposed end surfaces or only the end surfaces of every other internal electrode exposed on a side surface of the element are surrounded and covered by an insulating layer of an inorganic material, particularly, glass or glass-ceramics. The invention also provides a method of producing such an electrostrictive effect element in which the glass or glass-ceramics insulating layer is formed by an electrophoretic process and is then sintered into an integral body with the internal electrodes and the electrostrictive material.

The glass or glass-ceramics insulating layer can be formed by immersing the laminated structure having the alternating layers of the electrostrictive material and the electrode material in a suspension of positively charged glass powder, and applying a voltage between the internal electrodes on which the insulating layer is to be formed and an opposing electrode plate disposed in the suspension, to thereby deposit the positively charged glass powder onto the exposed end surfaces of the mentioned internal electrodes.

Alternatively, the glass or glass-ceramics layer can be formed by placing the laminated structure in the suspension to deposit the previously charged glass powder onto the whole surface of the laminated structure, and applying an electric field between the internal electrodes on which the glass or glass-ceramics layer is not to be formed and an opposing electrode plate disposed within the suspension, to thereby create an electrostatic force which removes the glass powder by only from the mentioned internal electrodes.

In either case, the glass powder desposited on the internal electrodes should have a thermal expansion coefficient similar or substantially equal to that of the electrostrictive material. Considering adhesion property and sinterability, the glass powder preferably has a grain size ranging between 1.0 and 2.0 m$^2$/g in terms of BET specific surface area.

The suspension may deteriorate on adhesion of the glass powder to the laminated structure of the electrostrictive material. Such deterioration, however, can be avoided by stirring the suspension and bubbling the same by blowing in an inert gas.

According to the invention, it is possible to obtain an electrostrictive effect element having inorganic insulating layers which exhibit good insulation properties and reliability, without impairing the expansion and contraction of the electrostrictive effect elements and without suffering from cracking due to the expansion and contraction of the electrostrictive effect element.

DESCRIPTION OF THE PREFERRED EMBODIMENTS

Figure 1:
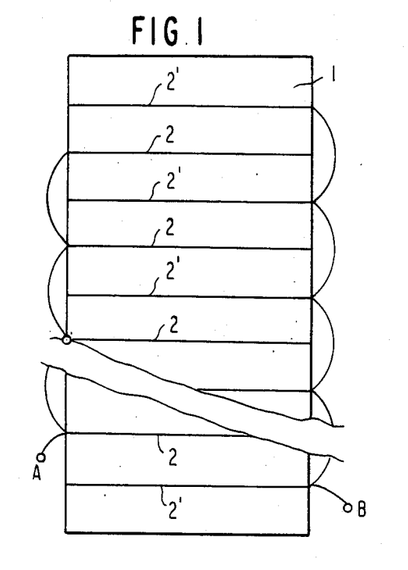
FIG. 1 is a schematic sectional view of a laminated-type electrostrictive effect element shown in the prior art.
Figure 2:
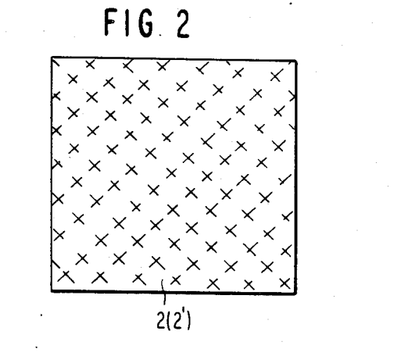
FIG. 2 is a plan view of the element of FIG. 1.

FIGS. 1 and 2 show a laminated-type electrostrictive effect element which is disclosed in the specification of the copending U.S. application Ser. No. 493,583. As will be seen from FIG. 1, which is a side elevational view, internal electrode plates 2, 2' and films or thin plates 1 of electrostrictive material are stacked in layers such that the internal electrode plate 2 and the internal electrode plate 2' appear alternatingly. The ends of the internal electrode plates 2 are connected to one another and also to an external terminal A, while the internal electrodes 2' are connected to an external terminal B. As shown in FIG. 2, the internal electrode plates 2 and 2' are formed over the entire area of the main surface of the film 1 so that a uniform electric field distribution is formed in the film 1 of the electrostrictive material to cause a uniform displacement of the element, as an electric voltage is applied between the external terminals A and B. In this laminated-type electrostrictive effect element, however, it is extremely difficult to achieve mutual electric connection of the internal electrode plates 2 and the mutual electric connection of the internal electrode plates 2'.

Figure 3:
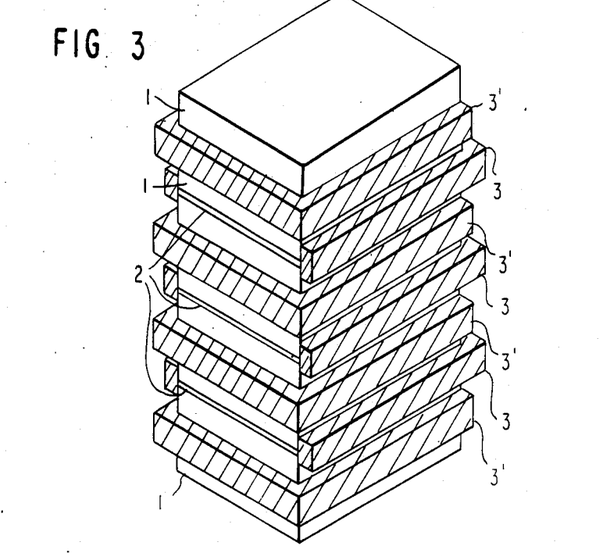
FIG. 3 is a perspective view of a first embodiment of the invention.
Figure 4:
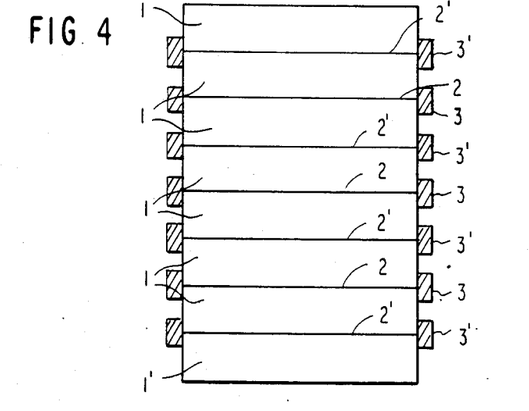
FIG. 4 is a sectional view of the first embodiment.

FIGS. 3 and 4 are a perspective view and a sectional view of a first embodiment of the invention. It will be seen that, in the electrostrictive element of the invention, only three of the four exposed side ends of the respective internal electrodes 2, 2' and their adjacent areas of the side surfaces of the films 1 of the electrostrictive material are coated by glass insulating layers 3 and 3'. Therefore, the strain of the insulating layers 3, 3' in response to the expansion or contraction of the electrostrictive material is minimized to completely eliminate cracking of the insulating layers. Although not shown in FIG. 3, external electrodes are formed by separately coating the opposing two side faces of the laminated structure where the side ends of the internal electrodes 2 and 2' are respectively exposed, with respective layers of silver-platinum paste.

As an example, a laminated-type electrostrictive effect element of the invention was produced from an electrostrictive material of 10 mm long and consisting mainly of Pb(Mg $\frac{1}{3}$ Nb $\frac{2}{3}$)O$_3$. This element showed an elongation to 10.01 mm when a voltage of 1 KV/mm was applied thereto. If the insulating layers are formed over the entire side surfaces of this element, a force is applied to the insulation layers to forcibly elongate the insulation layers to a length corresponding to the increased length of 10.01 mm. Moreover, an undesirable bending force is applied to the element in response to the expansion or contraction of the element because the insulating layers act to resist the expansion or contraction. This bending undesirably causes cracking or separation in the insulating layers and the element.

However, by dividing each insulation layer into a plurality of strips 3 and 3' which cover only the exposed ends of the internal electrodes 2 and 2' and their neighboring portions of the side surfaces of the films 1 according to the invention, the elongation and bending forces applied to the insulation layer are substantially eliminated, so that the undesirable cracking and separation in the insulation layer are prevented even when the electrostrictive effect element is expanded and contracted.

A description will be made hereinunder of an embodiment of the method of the invention for producing the laminated-type electrostrictive effect element.

Powder of electrostrictive material consisting essentially of lead magnesium niobate Pb(Mg $\frac{1}{3}$ Nb $\frac{2}{3}$) is dispersed together with an organic binder in a solvent to form a slurry. A green ceramics sheet having a uniform thickness of 30 to 200 μm is formed from this slurry by a casting method employing a doctor blade. Rectangular sheets of 60 mm long and 40 mm wide are punched out from the green ceramics sheet and internal electrodes are formed on the surface of each sheet with platinum paste by a screen printing method. A plurality of the rectangular, green ceramics sheets having the internal electrodes are stacked to form a laminated structure. This laminated structure is then sintered at a temperature of 900° to 1200° C. to form a sintered laminated body.

The sintered body is then cut into square pieces having a side length of 5 mm by means of a diamond cutter. Electrodes for external connection are formed on the exposed portions of the internal electrodes along side surfaces of the cut piece. After connecting leads to these external electrodes, this piece is immersed in an electrophoretic cell. Insulating layers are deposited on exposed surfaces of the internal electrodes and the portions adjacent thereto, by applying a D.C. voltage, of 50 V for 30 seconds between the leads and an opposing electrode disposed in the cell. The piece, after the deposition of the insulating layers, is then subjected to a heat treatment at 710° C. for 10 minutes to sinter the deposited layer so that it becomes an integral part of the element. Subsequently, silver-platinum paste is applied to every other layer of exposed internal electrode by, for example, a screen printing method to form external electrodes.

Figure 5:
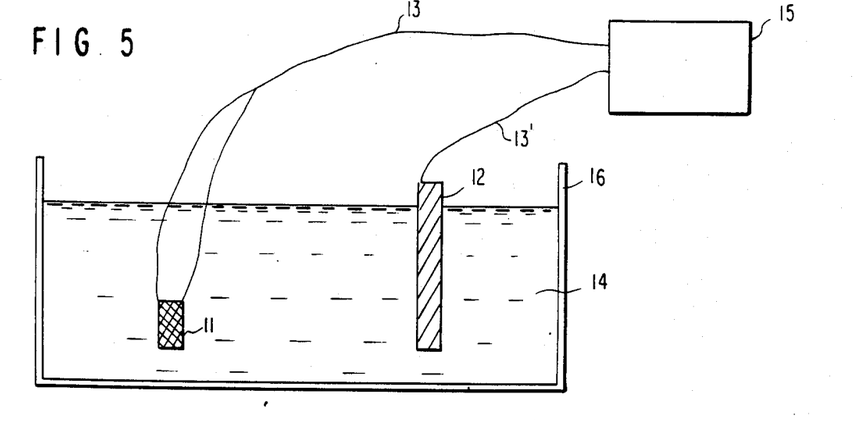
FIG. 5 is a sectional view of an example of the apparatus used for forming an insulating layer by electrophoretic method according to the invention.

FIG. 5 shows an example of an apparatus for depositing insulating layers on the exposed internal electrodes by an electrophoretic process, suitable for use in the method of the invention. In this Figure, a glass vessel 16 is filled with the slurry 14 of the insulating powder and an electrostrictive effect element 11 and an opposing electrode 12 are immersed in the slurry 14. They are connected to a D.C. power supply 15 by means of lead wires 13 and 13'.

The slurry used for the electrophoretic process in this embodiment had the following composition.

zinc borosilicate glass: 10 wt%
ethanol: 85 wt%
polyvinyl butyral: 5 wt%

The grain size of the zinc borosilicate glass powder was 1.5 m$^2$/g in terms of BET value.

An A.C. voltage of 300 V at 50 Hz was applied for 100 hours to the electrostrictive effect element with the insulating layers thus formed thereon to cause cyclic expansion and contraction of the element, but no defect in electric characteristic such as insulation failure was caused nor troubles such as cracking and separation of the insulating layers were observed. It was thus confirmed that the element produced by this invention can be used practically as the electrostrictive element.

In order to determine the optimum grain size, 5 (five) kinds of elements having insulating layers made from glass powders of different grain sizes were prepared. More specifically, glass powders of grain sizes of 0.7 m$^2$/g, 1.0 m$^2$/g, 1.50 m$^2$/g, 2.0 m$^2$/g and 2.8 m$^2$/g were prepared. With these five kinds of glass powder, experiments of deposition by the electrophoretic process and of sintering were conducted as follows using the above-mentioned laminated structure of the electrostrictive material, in order to examine the adhesion property and sinterability.

In the experiments, 30 g of zinc borosilicate crystalline glass powder, 290 ml of ethanol and 10 ml of 5% ethanol solution of iodine were mixed together by a high-speed homogenizer. The iodine serves as an electrolyte so that the glass powder is charged positively. After a 30 minute application of ultrasonic wave, the mixture was settled for 30 minutes and the sediments were removed to leave a suspension solution which was used as the slurry for the electrophoretic process. Insulating layers were deposited on the laminated structures of the electrostrictive material by means of the apparatus as shown in FIG. 5.

Figure 6:
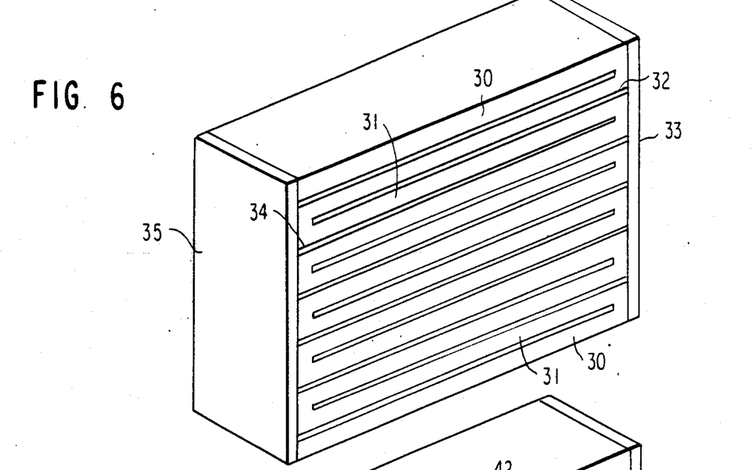
FIG. 6 shows a perspective view of a laminated structure before the insulating layers are deposited in a second embodiment of the invention.
Figure 7:
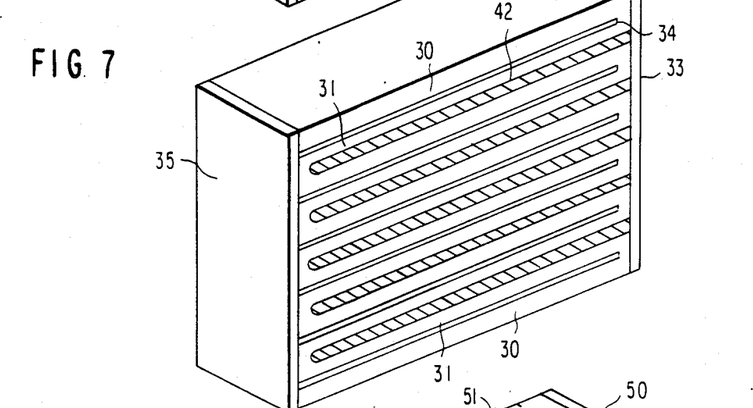
FIGS. 7 and 8 show a perspective view of the laminated structure on which glass layers are formed on the exposed portions of the internal electrodes and on the electrostrictive material adjacent thereto in the second embodiment.

The following Table shows the experimental results of the deposition and the sintering. The term "deposition time" represents the length of time required for obtaining a sufficiently large width of deposition. The double-circle mark represents the case where the sufficient width of deposition can be obtained in a short time. In the case where a glass powder of a large particle size was used, the glass powder was sedimented in the vessel during the experiment impairing the deposition. Such case is marked with a cross.

the internal electrodes 32 and 34 are connected at the exterior, is first prepared as shown in FIG. 6. The internal electrodes 32 and 34 are exposed at the end surfaces of the laminated structure as shown. First, every other layer 32 of the internal electrodes are connected electrically to form one group. Second, every other layer 34 of internal electrodes are connected electrically to form another group. These groups are connected to two temporary external electrodes 33 and 35, respectively. In order to deposit the insulation material on the exposed portion of the internal electrodes sandwiched between adjacent layers 30, 31 of the electrostrictive material, and the areas around the exposed portions, the laminated structure is immersed in a suspension solution containing charged glass powder (not shown), after covering the back side surface of the laminated structure by an adhesive tape or the like to prevent unnecessary deposition to the reverse side. Then, an opposite electrode plate (not shown) is placed in front of the front side surface of the laminated structure, and a D.C. voltage is imposed between the opposing electrode and the external electrode 33. Consequently, the positively charged glass powder is forced to move in the suspension solution by the force produced by the electric field which is directed from the opposing electrode plate towards the exposed portions of the internal electrodes 32 connected to the external electrodes 33. In this way the glass powder 42 is deposited only on the exposed portion of the internal electrodes 32 connected to the external electrode 33 and the portions of the exposed surface of the material 30 and 31 around these exposed portions but not to the exposed portions of the internal electrodes 34 connected to the external electrode 35, as shown in FIG. 7. The laminated structure is then withdrawn from the suspension liquid, dried and fired to sinter the glass powder, to produce belts of glass coat-

TABLE

| glass powder particle size BET specific surface area (m$^2$/g) | Effect of Particle Size of Glass Powder in Electrophoretic Process | | | | | | |
|---|---|---|---|---|---|---|---|
| | adhesion property | | | | sinterability | | |
| | line width | discontinuity and contraction | deposition time | sedimentation of powder | void removal | sintering | sintering time |
| 0.7 | x | x | x | x | | | |
| 1.0 | | | | | | | |
| 1.5 | | | | | | | |
| 2.0 | | | | | | | |
| 2.8 | | | | | x | x | x |

When the particle size of the glass powder used was extremely fine, it was impossible to remove the voids even by holding the glass powder for a long time at a temperature near the softening point. However, it was confirmed that, with the glass powder marked with a single circle, the voids could be removed by maintaining the glass for about 4 hours at a temperature around the softening point of 600° C. As will be understood from the Table, the glass having a smller particle size than 1.0 m$^2$/g exhibits an inferior adhesion property, while the glass having particle size greater than 2.0 m$^2$/g exhibits inferior sinterability. From this point of view, the particle size of the glass powder should be selected in range between 1.0 and 2.0 m$^2$/g in terms of BET value.

FIGS. 6 to 10 show a second embodiment of the invention.

A laminated structure of an electrostrictive material 30, 31, having a multiplicity of internal electrodes 32 and 34 and external electrodes 33 and 35 through which ing films 42 formed to cover the exposed portions of every other layer 32 of the internal electrodes. The laminated structure having such belts of glass coating films 42 will be best seen from FIG. 7. It will be understood from this Figure that the belts of glass coating films 42 are formed on every other layer 32 of the internal electrodes, while the exposed portions of the internal electrodes 34 are left uncovered. A reference numeral 30 designates the electrostrictive material constituting the protecting film portion. In the process for forming the glass coating film belts 42, there is a possibility that the glass powder also attaches, although slightly, to the internal electrodes 34 which are not to be coated. This, however, can be avoided by connecting the external electrode 35 to the opposing electrode plate to keep the external electrode 35 at the same potential as the opposing electrode plate.

In the same manner, the glass insulation layer is provided also on the back side surface of the laminated structure in the same pattern as the front side. To this end, the laminated structure is immersed in the suspension liquid (not shown) after covering the front side surface of the same to avoid unnecessary attaching of the glass powder. Then, the opposing electrode plate (not shown) is placed in front of the back side and voltage is applied between the opposing electrode plate and the external electrode 35, to thereby deposit the glass powder onto the exposed portions of the internal electrodes 34. Subsequently, the laminated structure is subjected to a firing to sinter the glass powder to thereby form belt-like coating films of glass.

Figure 8:
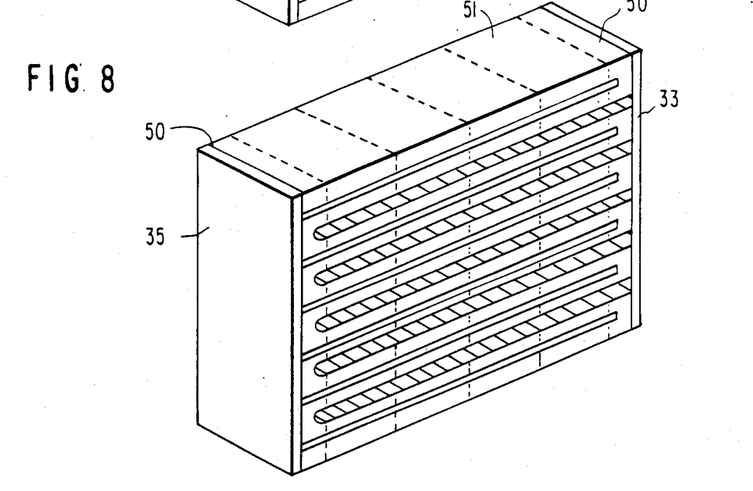
Figure 9:
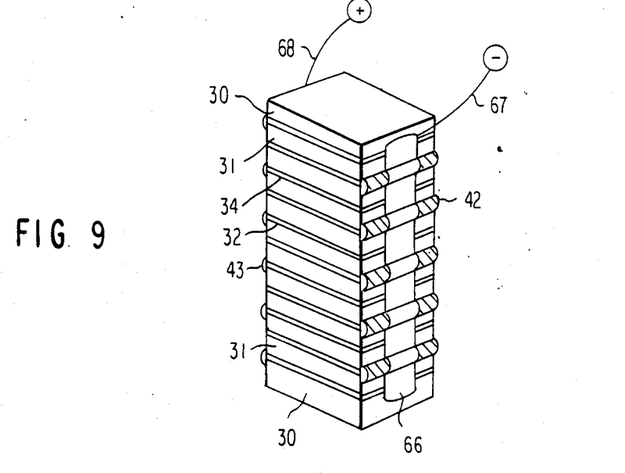
FIG. 9 shows a perspective view of an electrostrictive effect element cut out from the portion shown by broken line in FIG. 8 and provided with external electrodes in the second embodiment.

Then, the laminated structure of electrostrictive material having belts of glass coating films on both sides is cut along the broken lines in FIG. 8 into the final size of the electrostrictive effect element. At least the two portions 50 near the external electrodes have to be cut away. Since the two small pieces 50 with the temporary external electrodes 33, 35 cannot be used as an electrostrictive effect element. By effecting the cutting in the manner shown in FIG. 8, a plurality of electrostrictive effect elements 51 are obtained from one laminated structure of the electrostrictive material. It is possible to electrically connect the electrostrictive effect elements by forming external electrodes 66 on the front and back side surfaces of the elements across the belts of glass coating films and the exposed internal electrodes as shown in FIG. 9 by a screen printing method with a silver-platinum paste. Numerals 67 and 68 denote external terminals.

In the production of the electrostrictive effect element, it is often experienced that the suspension solution causes only an inferior deposition of the insulating material to the exposed portions of the internal electrodes of the laminated structure or the suspension liquid which initially showed superior deposition characteristic begins to exhibit a poor deposition characteristic in a short period of time. This may be attributed to the fact that the oxygen in the air is dissolved in the suspension solution to change the charging state of the glass powder.

Figure 10:
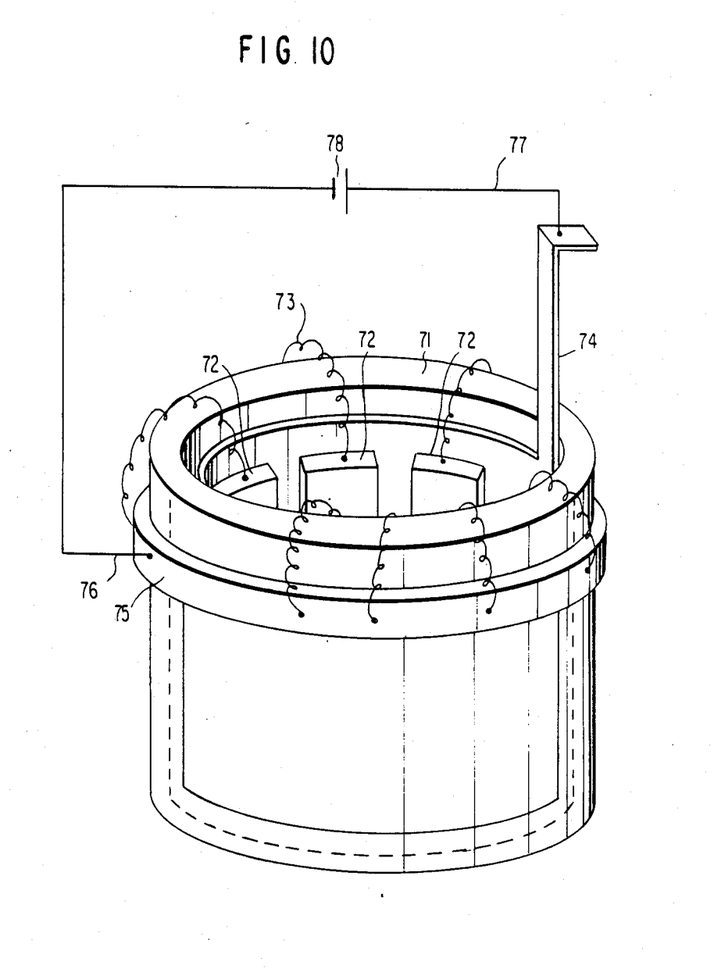
FIG. 10 is a perspective view of an electrophoretic apparatus for producing a plurality of laminated structures of electrostrictive material.
Figure 11:
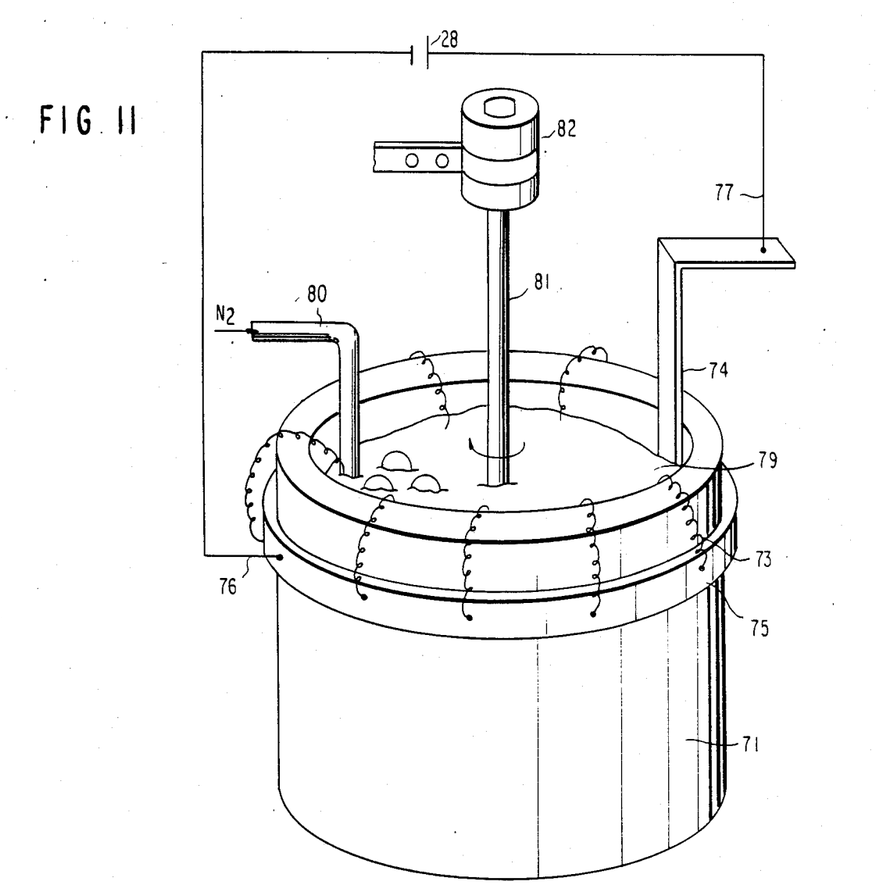
FIG. 11 shows the electrophoretic apparatus as shown in FIG. 10 with a stirring bar and a bubbling pipe.

FIGS. 10 and 11 illustrate the assembling and connection of an electrophoretic apparatus which stirs the suspension solution and bubbles the same by blowing nitrogen gas. A plurality of laminated structures 72 of the electrostrictive material are placed in a cylindrical vessel 71 with the side thereof to be coated directed outwardly, while the back surface which is not to be coated is covered by an adhesive tape. An electric wire 73 is attached and connected to a temporary external electrode to which the internal electrodes to be coated are commonly connected. The wires 73 are connected to a ring 75 which is in turn connected to the negative terminal 76 of the D.C. power supply 78. A cylindrical opposing electrode 74 is disposed between the front surface of the laminated structure and the vessel. The opposing electrode 74 is connected to the plus terminal 77 of the D.C. power source 78. FIG. 11 shows an electrophoretic apparatus having a stirring bar and a bubbling pipe. More specifically, bubbling of the suspension solution is effected by nitrogen gas blown by a stainless pipe 80 of 5 mm dia. inserted into the suspension solution 79, while the stirring is effected by an impeller 81 driven by a motor 82. Although not shown, impeller blades are attached to the lower end of the impeller 81. The flow rate of the nitrogen gas may be in the order of 150 liters per hour.

In order to stably form the glass powder in the belt form on the end surface of the laminated body of the electrostrictive material, there are two important factors: namely, maintaining the electric charge on the glass powder in the suspension solution and maintaining the solution in a state of turbulence to cause a uniform deposition on the end surface of the laminated structure. To these ends, the bubbling of the suspension solution by an inert gas such as nitrogen gas and the stirring of the suspension solution produce remarkable effects. Namely, by adopting the bubbling and stirring, it is possible to obtain excellent insulation films and, hence, to produce an electrostrictive effect element which has a high dielectric strength.

In the embodiment described hereinbefore, a D.C. voltage is applied to the desired internal electrodes so that the insulating glass powder is deposited only to these internal electrodes and the portions around these internal electrodes of the laminated structure. These described embodiments, however, suffer from a disadvantage that a discontinuation or contraction tends to appear in the belt of insulation formed by the deposition of the glass powder. This may be attributed to the fact that the electric field is locally weakened by a convection in the suspension solution to impair the deposition of the glass powder to some portions. When the external electrode is formed after firing and fixing of such insulation film, a short-circuiting will occur at the discontinuation of the insulation film and a serious reduction of dielectric strength will occur on the contracted portion to make the element practically unusable.

Figure 12:
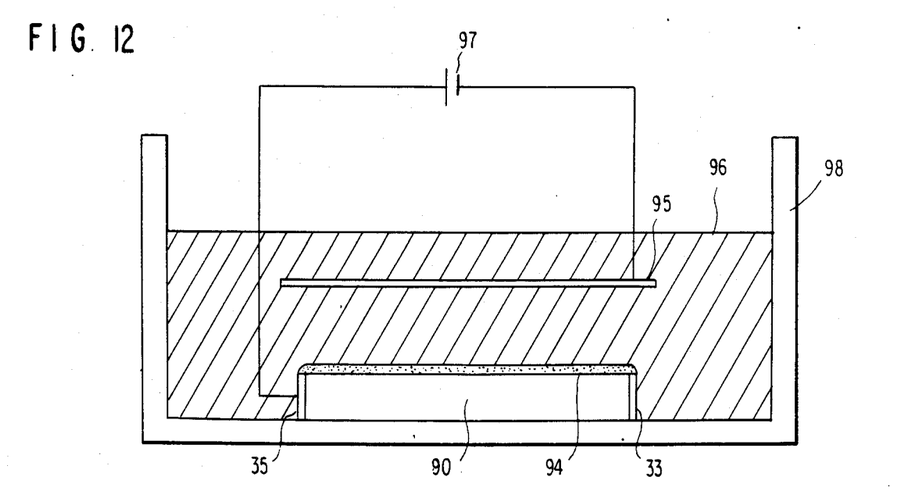
FIG. 12 is a sectional view of a production apparatus for use in a fourth embodiment of the invention.

A fourth embodiment of the invention aims at obviating this problem. According to this fourth embodiment, the laminated structure of electrostrictive material and internal electrodes is prepared as shown in FIG. 6. The laminated structure 90 is immersed in a suspension solution 96 containing glass powder as shown in FIG. 12, to thereby deposit the glass powder to the whole area of the exposed end surfaces of the internal electrodes. Subsequently, an opposing electrode 95 is placed in the same suspension solution 96, and a D.C. voltage 97 is applied between the temporary external electrode 35 and this opposing electrode plate 95. The internal electrodes 34 (FIG. 6) connected to the temporary external electrode 35 and the glass powder deposited on these internal electrodes and their vicinities are charged positively even after the deposition thereof, so that the glass powder is removed from the surface of the laminated structure by the electrostatic force which acts in the direction of the D.C. voltage. The pattern of the insulation thus obtained is identical to that shown in FIG. 7 which is obtained through the ordinary electrophoretic process, i.e. by the application of D.C. voltage from the opposing electrode towards the temporary external electrode 33. In the fourth embodiment, however, the layer of the deposited glass powder initially formed on the whole area of the exposed surfaces of the internal electrodes is a perfect one having no defect. In addition, there is no fear that the glass powder layer on the internal electrodes 32 and the ceramics therearound, on which the insulation coating films are to be left, are not broken at all, even by the application of the voltage after the deposition.

Thus, this fourth embodiment is characterized in that the glass powder is first deposited over the entire area and then only the unnecessary portion of the glass powder layer is removed. According to this method, it is possible to obtain a perfect deposition of the glass powder on the portions demanding the insulation coating, although there may be a slight deposition of the glass powder to the portions which are not necessary to be coated by the insulation film, so tht the belts insulation film can be formed in a good order without suffering from discontinuity or contraction.

After the application of the voltage, the laminated structure is withdrawn from the suspension solution and is dried, followed by firing in the air at 710° C. to sinter the glass powder. Thereafter, the insulation film is formed on the back side of the laminated structure. The laminated structure is then cut along the broken lines in FIG. 8. Then, belts of external electrodes 66 (FIG. 9) are formed on two surfaces on which the insulation films 42 are formed. By so doing, it is possible to electrically connect the electrostrictive effect elements.

Thus, the fourth embodiment of the invention permits the formation of a delicate insulation pattern with high reliability. In addition, the control of the thickness of the insulation film, which has been hitherto difficult to conduct, can be conducted simply by controlling the immersion time in the suspension solution.

What is claimed is:

1. A method of producing an electrostrictive effect element comprising the steps of:
    preparing a laminated structure having layers of an electrostrictive material and layers of internal electrodes superposed alternatingly, two external electrodes which are connected respectively to every other layer of the internal electrodes to provide a first group of said layers of internal electrodes connected to one of said two external electrodes and a second group of internal electrodes connected to the other of said two external electrodes, said internal electrodes being exposed in two surfaces of said laminated structure parallel to the direction of lamination and in other than the surfaces on which said two external electrodes are formed;
    placing said laminated structure in a suspension solution containing an inorganic insulating material, applying a D.C. voltage between one of said two external electrodes of said laminated structure and an electrode plate disposed outside said laminated structure to thereby effect an electrophoretic deposition process to selectively form belts of insulation layers of said inorganic insulating material only on and around every other one of the internal electrodes exposed in one of said two surfaces in which said internal electrodes are exposed and forming said first group of internal electrodes and to leave the other internal electrodes and the layers of said electrostrictive material in said one of said two surfaces exposed;
    applying a D.C. voltage between the other of said two external electrodes and said electrode plate to effect an electrophoretic deposition process to thereby selectively form belts of insulation layers only on and around the other alternate internal electrodes in the other of said two surfaces of said laminated structure forming said second group of said layers of internal electrodes and to leave the portions in said other of said two surfaces exposed; and
    removing said two external electrodes by cutting the portions of said laminated structure in the vicinity of said two external electrodes.

2. A method of producing an electrostrictive effect element having the steps of preparing a laminated structure of an electrostrictive material composed of layers of said electrostrictive material and layers of internal electrodes superposed alternatingly, placing said laminated structure in a suspension solution containing electrically charged glass powder so as to deposit said glass powder over the entire area of an end surface of said laminated structure where ends of said internal electrodes are exposed, and applying an electric field between an opposing electrode plate disposed in said suspension solution and the internal electrodes which are not to be coated with said glass powder to thereby remove said glass powder by an electrostatic force only on said internal electrodes which are not to be coated with said glass powder so as to form a plurality of separated belts of glass coating films on said end surface of said laminated structure.

3. A method of producing an electrostrictive effect element comprising the steps of:
    forming a laminated structure having layers of an electrostrictive material and layers of internal electrodes superposed alternatingly, placing said laminated structure in a suspension solution containing electrically charged glass powder, applying a D.C. voltage between a first electrode constituted by whole or parts of said layers of internal electrodes and a second electrode constituted by an opposing electrode plate, so that said electrically charged glass powder is deposited by electrophoresis on the whole or parts of said layers of internal electrodes exposed in the surfaces of said laminated structure and on portions of said layers of said electrostrictive material around the exposed portions of said layers of said internal electrode, so as to selectively form a plurality of separated belts of glass coating films on said laminated structure, and blowing an inert gas into said suspension solution to bubble said solution.

4. A method of producing an electrostrictive effect element according to claim 3, further including the step of stirring said suspension.

5. A method of producing an electrostrictive effect element comprising the steps of:
    preparing a laminated structure having films or thin plates of electrostrictive material and internal electrodes superposed alternatingly in such manner that their respective principal surfaces are faced to each other, said laminating structure having flat side surfaces perpendicular to said principal surfaces and exposing cross sections of said internal electrodes on said flat side surfaces;
    placing said laminated structure having said flat side surfaces in a suspension solution containing glass powder and selectively depositing said glass powder only on said cross sections of every other one of said internal electrodes and portions of the layers of the electrostrictive material therearound exposed on said flat side surfaces by an electrophoretic deposition process with the other portions of said layer of said electrostrictive material or said flat side surfaces being maintained exposed; and
    thereafter sintering said glass powder selectively deposited only on said cross sections of said every other one of said internal electrode layers and said portions of the layers of the electrostrictive material therearound at said flat side surfaces of the laminated structure to form a plurality of separated belts of glass coating films on said flat side surfaces.

6. A method of producing an electrostrictive effect element according to claim 5, wherein said glass powder has a particle size ranging between 1.0 and 2.0 m²/g in terms of BET specific surface area.

7. A method of producing an electrostrictive effect element according to claim 6, wherein said glass powder is a zinc borosilicate glass powder.

8. A method of producing an electrostrictive effect element as claimed in claim 5, wherein said step of selectively depositing glass powder includes the steps of attaching temporary external electrodes for external connection to exposed cross sections of the internal electrodes along said flat side surfaces of the laminated structure, immersing the laminated structure in an electrophoretic cell containing a slurry of glass powder, applying a D.C. voltage between the electrodes for external connection, and an opposing electrode disposed in the cell to deposit the glass powder only on the exposed portions of the internal electrodes and therearound.

9. A method as claimed in claim 8, further including the step of maintaining alternate internal electrodes exposed on a side surface of the laminated structure during the deposition of the glass powder and applying a paste of conductive material to said exposed cross sections of alternate internal electrodes.

10. A method of producing an electrostrictive effect element as claimed in claim 16, further including the steps of attaching an external electrode to alternate ones of said internal electrodes forming a first group along one side surface of the laminated structure, attaching another external electrode to alternate ones of said internal electrodes different from said first group and forming a second group along a second side surface of said laminated structure, covering a third side surface of said laminated structure with tape to prevent deposition of glass powder thereon, immersing the laminated structure in a suspension solution containing a charged glass powder, placing an opposing electrode plate in said suspension solution, connecting a D.C. voltage source to one of the external electrodes and the opposing electrode plate to deposit strips of glass powder only on exposed ends of the internal electrodes and therearound in a fourth side surface of said laminated structure connected to said external electrode attached to the D.C. voltage source.

11. A method of producing an electrostrictive effect element as claimed in claim 10, further including the step of cutting said laminated structure into at least three pieces in the direction of the lamination, each of two of said pieces containing one of said external electrodes and a portion of the laminated structures to form at least one electrostrictive effect element.

12. A method of providing an electrostrictive effect element according to claim 5, further including the step of respectively forming first and second external conductive layers on said flat side surfaces to electrically connect said first and second external conductive layers with exposed cross sections of said internal electrodes after forming said glass powder on every other one of the exposed said cross sections of the internal electrodes.

13. A method of producing an electrostrictive effect element according to claim 5, wherein each of said films or thin plates of electrostrictive material has a substantially uniform thickness of 30 to 200 m.

14. A method of producing an electrostrictive effect element comprising the steps of:
preparing a laminated structure having films or thin plates of electrostrictive material and layers of internal electrodes superposed alternatingly and having side surfaces exposing cross sections of said internal electrodes parallel to the direction of lamination;
selectively forming a first group of belts of insulation layers and a second group of belts of insulation layers on a first side surface and a second side surface of said laminated structure by immersing said laminated structure in a suspension solution containing a slurry of an insulation material powder and applying a D.C. voltage between said internal electrodes and an electrode plate disposed outside said laminated structure to thereby effect an electrophoretic deposition process such that said first group of belts of insulation layers cover only every other of said internal electrodes and portions of the film or thin plates of electrostrictive material therearound exposed on said first side surface to provide a first group of internal electrodes and the other portions of the film or thin plates of electrostrictive material exposed on said first side surface and said second group of belts of insulation layers only cover said first group of internal electrodes and the other portions of the film or thin plates of electrostrictive material therearound exposed on said second side surface to provide a second group of internal electrodes and the other portions of the films or thin plates of electrostrictive material exposed on said second side surface; and
thereafter forming a first external conductive layer on said first side surface so as to commonly cross over said first group of belts of insulation layers and to contact with said first group of internal electrodes exposed on said first side surface and a second external conductive layer on said second side surface so as to commonly cross over said second group of belts of insulation layers and to contact with said first group of internal electrodes exposed on said second surface.

15. A method of producing an electrostrictive effect element according to claim 14, wherein said side surfaces of the laminated structure are perpendicular to principal surfaces of said films or thin plates of electrostrictive material and internal electrodes.

16. A method of producing an electrostrictive effect element comprising the steps of:
preparing a laminated structure having layers of an electrostrictive material and layers of internal electrodes superposed alternatingly, two external electrodes which are connected respectively to every other layer of the internal electrodes to provide a first group of internal electrodes connected to one external electrode and a second group of internal electrodes connected to the other external electrode, said internal electrodes being exposed in two surfaces of said laminated structure parallel to the direction of lamination and in other than the surfaces on which said external electrodes are formed;
covering one of said two surfaces with tape to prevent deposition of insulating material thereon;
placing said laminated structure in a suspension solution containing an inorganic insulating material, applying a D.C. voltage between one of said external electrodes of said laminated structure and an electrode plate disposed outside said laminated structure to thereby effect an electrophoretic deposition process to form belts of insulation layers of said inorganic insulating material only on and around every other internal electrode exposed in the other of said two surfaces in which said internal electrodes are exposed and forming said first group of internal electrodes;

removing said tape on the one of said two surfaces and covering the other of said two surfaces with a second tape to prevent further deposition of the inorganic insulating material thereon;

placing again said laminated structure with said second tape in said suspension solution;

applying a D.C. voltage between the other electrode and said electrode plate to effect an electrophoretic deposition process to thereby form belts of insulation layers only on and around the other alternate internal electrodes in the one of said two surfaces of said laminated structure forming said second group of internal electrodes;

removing said second tape and the portions of said laminated structure in the vicinity of said external electrodes;

sintering said belts of insulation layers on said two surfaces;

forming a first external conductive layer on both of said belts of insulation layers and said first group of internal electrodes exposed on the one of said two surfaces; and forming a second external conductive layer on both of said belts of insulation layers and said second group of internal electrodes exposed on the other of said two surfaces.

17. A method of producing an electrostrictive effect element comprising the steps of:

laminating a plurality of green ceramic sheets of electrostrictive material and a plurality of layers of internal electrodes alternatingly, said layers of internal electrodes being classified into first and second groups, the first group of said layers of internal electrodes consisting of every other one of said layers of the internal electrodes in the direction of the lamination, the second group of said layers of internal electrodes consisting of the remaining ones of said layers of internal electrodes, thereby to form a laminated structure;

sintering said laminated structure to form a sintered body cutting said sintered body to form a rectangular parallelepiped piece having first, second, third and fourth flat side surfaces parallel to the direction of the lamination, cross sections of said first group of said layers of internal electrodes being exposed on said first, second and fourth flat side surfaces and being unexposed on said third flat side surface, cross sections of said second group of said layers of internal electrodes being exposed on said second, third and fourth flat side surfaces and being unexposed on said first flat side surface;

forming a first layer which is a temporary external electrode on said first side surface to be electrically connected to said first group of internal electrodes;

forming a second layer which is a temporary external electrode on said third flat side surface to be electrically connected to said second group of said layers of internal electrodes;

covering said second flat side surface with tape to prevent deposition of insulating material thereon;

placing said rectangular parallelepiped piece with said tape in a suspension solution containing an insulating material;

applying a D.C. voltage between said first layer forming a temporary external electrode and an electrode plate disposed outside said rectangular parallelepiped piece to thereby effect an electrophoretic deposition process to selectively form first belts of insulation layers of said insulating material only on and around said first group of said layers of internal electrodes exposed on said fourth flat side surface;

removing said tape on said second flat side surface and covering said fourth flat surface with a second tape to prevent further deposition of said insulating material thereon;

placing again said rectangular parallelepiped piece with said second tape in said suspension solution;

applying a D.C. voltage between said second layer of temporary external electrodes and said electrode plate to effect an electrophoretic deposition process to thereby selectively form second belts of insulation layers only on and around said second group of said layers of internal electrodes exposed on said second flat side surface;

removing said second tape, said first layer of temporary external electrode and said second layer of temporary external electrode from said rectangular parallelepiped piece;

sintering said first and second belts of insulation layers on said second and fourth flat side surfaces;

forming a first external conductive layer on both said second belts of insulation layers and said first group of said layers of internal electrodes exposed on said second flat side surface to obtain an electrical connection therebetween; and forming a second external conductive layer on both said first belts of insulation layers and said second group of said layers of internal electrodes exposed on said fourth flat side surface to obtain an electrical connection therebetween.

18. A method of producing an electrostrictive effect element comprising the steps of:

forming a plurality of green ceramic sheets having a uniform thickness of 30 to 200 μm from a slurry containing powder of electrostrictive material and organic binder;

forming a layer of an internal electrode on a surface of each of said green ceramic sheets;

laminating each of said plurality of said green ceramic sheets provided with said layer of internal electrodes to form a laminated structure having layers of an electrostrictive material and layers of internal electrodes superposed alternatingly, said layers of internal electrodes being classified into first and second groups, said first group of said layers of internal electrodes consisting of every other layer of said internal electrodes in the direction of the lamination, said second group of said layers of internal electrodes consisting of remaining ones of said internal electrodes other than said first group of said layers of internal electrodes;

sintering said laminated structure to form a sintered laminated body having first, second, third and fourth side surfaces parallel to the direction of the lmaination, cross sections of said first group of said layers of internal electrodes being exposed on said first, third and fourth side surfaces and being unexposed on said second side surface, cross sections of said second group of internal electrodes being exposed on said second, third and fourth side surfaces and being unexposed on said first side surface;

forming a first layer of temporary external electrodes on said first side surface to be electrically connected to said first group of said layers of internal electrodes;

forming a second layer of temporary external electrodes on said second side surface to be electrically connected to said second group of said layers of internal electrodes;

covering said third side surface with tape to prevent deposition of insulating material thereon;

placing said sintered laminated body with said tape in a suspension solution containing a glass powder having a particle size ranging between 1.0 and 2.0 $m^2/g$ in terms of BET specific surface area;

applying D.C. voltage between said first layer of temporary external electrodes and an electrode plate disposed outside said sintered laminated body to thereby effect an electrophoretic deposition process to deposit said glass powder on the cross sections of said first group of layers of internal electrodes exposed on said fourth side surface but not on the cross sections of said second group of said layers of internal electrodes exposed on said fourth side surface;

sintering said glass powder deposited on said fourth side surface to form a plurality of separated first belt-like glass coating films;

covering said fourth side surface with a second tape to prevent further deposition of said glass powder thereon;

placing again said sintered laminated body with said second tape in said suspension solution;

applying a D.C. voltage between said second layer of temporary external electrodes and said electrode plate to effect an electrophoretic deposition process to thereby deposit said glass powder on the cross sections of said first group of said layers of internal electrodes exposed on said third side surface but not on the cross sections of said second group of said layers of internal electrodes exposed on said third side surface;

sintering said glass powder deposited on said third side surface to form a plurality of separated second belt-like glass coating films;

forming a first external conductive layer on both of said second insulation layers and said first group of said layers of internal electrodes exposed on said third side surface to obtain electrical connection therebetween; and forming a second belt-like external conductive layer on both of said first insulation layers and said second group of said layers of internal electrodes exposed on said fourth side surface to obtain an electrical connection therebetween.

* * * * *

UNITED STATES PATENT AND TRADEMARK OFFICE
CERTIFICATE OF CORRECTION

PATENT NO. : 4,681,667

DATED : July 21, 1987

INVENTOR(S) : Kazuaki Utsumi et al.

It is certified that error appears in the above-identified patent and that said Letters Patent is hereby corrected as shown below:

Column 4, line 51, after "insulating powder" insert -- , --.

Column 5, line 57, "smller" should read -- smaller --.

Column 6, line 2, after "exterior" delete "," after "is first prepared" insert -- , --.

Columns 5 and 6, delete the present table and insert the following:

Table: Effect of Particle Size of Glass Powder in Electrophoretic Process

| glass powder particle size BET specific surface area ($m^2/g$) | adhesion property | | | | sinterability | | |
|---|---|---|---|---|---|---|---|
| | line width | discontinuity and contraction | deposition time | sedimentation of powder | void removal | sintering | sintering time |
| 0.7 | x | x | x | x | ◎ | ◎ | ◎ |
| 1.0 | ○ | ○ | ○ | ○ | ◎ | ◎ | ◎ |
| 1.5 | ◎ | ○ | ○ | ○ | ◎ | ○ | ○ |
| 2.0 | ◎ | ○ | ◎ | ◎ | ○ | ○ | ○ |
| 2.8 | ◎ | ○ | ◎ | ◎ | x | x | x |

UNITED STATES PATENT AND TRADEMARK OFFICE
CERTIFICATE OF CORRECTION

PATENT NO. : 4,681,667
DATED : July 21, 1987
INVENTOR(S) : Kazuaki Utsumi et al.

It is certified that error appears in the above-identified patent and that said Letters Patent is hereby corrected as shown below:

Column 9, line 1, "tht" should read -- that --.

Column 11, line 26, delete "claim 16" snd insert -- claim 5 --.

Signed and Sealed this

Second Day of August, 1988

Attest:

Attesting Officer

DONALD J. QUIGG

Commissioner of Patents and Trademarks